(12) United States Patent
Chen (10) Patent No.: US 10,356,922 B2
(45) Date of Patent: Jul. 16, 2019

(54) MIDDLE FRAME AND FLEXIBLE DISPLAY DEVICE (71) Applicant: WUHAN CHINA STAR OPTOELECTRONICS SEMICONDUCTOR DISPLAY TECHNOLOGY CO., LTD., Wuhan, Hubei (CN)

(72) Inventor: Jun Chen, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/738,132

(22) PCT Filed: Nov. 24, 2017

(86) PCT No.: PCT/CN2017/112881
§ 371 (c)(1),
(2) Date: Dec. 20, 2017

(65) Prior Publication Data
US 2019/0132974 A1 May 2, 2019

(30) Foreign Application Priority Data
Oct. 26, 2017 (CN) .......................... 2017 1 1012167

(51) Int. Cl.
*H05K 7/02* (2006.01)
*H05K 7/04* (2006.01)
*H05K 5/02* (2006.01)
*H05K 5/00* (2006.01)
*E05D 7/04* (2006.01)

(52) U.S. Cl.
CPC ............. *H05K 5/0226* (2013.01); *E05D 7/04* (2013.01); *H05K 5/0017* (2013.01); *H05K 5/0217* (2013.01); *E05D 2007/0484* (2013.01); *E05Y 2900/606* (2013.01)

(58) Field of Classification Search
USPC ........................................................ 361/807
See application file for complete search history.

(56) References Cited

U.S. PATENT DOCUMENTS

| | | | | |
|---|---|---|---|---|
| 9,632,541 B2* | 4/2017 | Xin | ....................... | G06F 1/1681 |
| 9,860,999 B1* | 1/2018 | Hsu | ...................... | E05D 3/06 |
| 2014/0174226 A1* | 6/2014 | Hsu | ...................... | E05D 3/122 74/98 |
| 2017/0328102 A1* | 11/2017 | Kato | ..................... | E05D 11/087 |

* cited by examiner

*Primary Examiner* — Hung S. Bui
(74) *Attorney, Agent, or Firm* — Soroker Agmon Nordman (57) ABSTRACT

This disclosure provides a middle frame and a flexible display device. The middle frame comprises a first framework component, a second framework component and a flexible component comprising a first chain link element, a second chain link element, a third chain link element, a fourth chain link element, a flexible element and a plurality of rotors. Under collaboration of the plurality of rotors, the third chain link element is connected to the first framework component and the third chain link element, the third chain link element is connected to the flexible component, the second chain link element is connected to the second framework component and the fourth chain link element, and the fourth chain link element is connected to the flexible component.

19 Claims, 6 Drawing Sheets

MIDDLE FRAME AND FLEXIBLE DISPLAY DEVICE

BACKGROUND

1. Field of Invention

The present disclosure relates to the field of display technology, and more particularly to a middle frame and a flexible display device.

2. Description of the Prior Art

Along with development of mobile terminals, mobile terminals having a large screen are increasingly popular.

With increasing screen sizes, the mobile terminals have problems of increasing size and poor portability. Flexible display devices having a bending property are produced to solve the problem. However, existing flexible display devices will be crumpled and even damaged, when the flexible display devices are bent.

SUMMARY

The present disclosure provides a test circuit for a display panel and a display device to make a lower cost of the display device.

The present disclosure provides a middle frame comprising:

a first framework component, a second framework component and a flexible component comprising a first chain link element, a second chain link element, a third chain link element, a fourth chain link element, a flexible element and a plurality of rotors;

the first chain link element rotary connected to the first framework by the rotor, and slideably connected to the third chain link element by the rotor;

the third chain link element rotary connected to the flexible element by the rotor;

the second chain link element rotary connected to the second framework component by the rotor, and slideably connected to the fourth chain link element by the rotor;

the fourth chain link element rotary connected to the flexible element by the rotor:

wherein the plurality of rotors comprise a plurality of first rotors with a fixed end and a moved end, and both the first chain link element and the second chain link element have a groove;

wherein the fixed end of the first rotor is fixed on the third chain link element, and the moved end of the first rotor is extended to the groove of the first chain link element to slide along the groove of the first chain link element;

wherein the fixed end of the first rotor is fixed on the fourth chain link element, and the moved end of the first rotor is extended to the groove of the second chain link element to slide along the groove of the second chain link element;

the plurality of the rotors comprise at least two axis pins;

wherein the third chain link element and the fourth chain link element are connected to the flexible element by the at least two axis pins respectively.

According to some disclosures, the fixed end of the plurality of first rotors comprises at least one fixed orifice;

wherein the fixed end of the first rotor is fixed on the first framework component by the at least one fixed orifice, and the moved end of the first rotor is connected to the first chain link element to make the first chain link element rotary connect to the first framework component;

wherein the fixed end of the first rotor is fixed on the second framework component by the at least one fixed orifice, and the moved end of the second rotor is connected to the second chain link element to make the second chain link element rotary connect to the second framework component.

According to some disclosures, the first chain link element comprises a padding layer disposed on inner walls of the groove.

According to some disclosures, the flexible element comprises a plurality of chain links and a plurality of fastenings;

wherein the plurality of chain links are rotary connected to each other by the plurality of the fastenings.

The present disclosure provides a middle frame comprising:

a first framework component, a second framework component and a flexible component comprising a first chain link element, a second chain link element, a third chain link element, a fourth chain link element, a flexible element and a plurality of rotors;

the first chain link element rotary connected to the first framework by the rotor, and slideably connected to the third chain link element by the rotor;

the third chain link element rotary connected to the flexible element by the rotor;

the second chain link element rotary connected to the second framework component by the rotor, and slideably connected to the fourth chain link element by the rotor;

the fourth chain link element rotary connected to the flexible element by the rotor.

According to some disclosures, the plurality of rotors comprise a plurality of first rotors with a fixed end and a moved end, and both the first chain link element and the second chain link element have a groove;

wherein the fixed end of the first rotor is fixed on the third chain link element, and the moved end of the first rotor is extended to the groove of the first chain link element to slide along the groove of the first chain link element;

wherein the fixed end of the first rotor is fixed on the fourth chain link element, and the moved end of the first rotor is extended to the groove of the second chain link element to slide along the groove of the second chain link element.

According to some disclosures, the fixed end of the plurality of first rotors comprises at least one fixed orifice;

wherein the fixed end of the first rotor is fixed on the first framework component by the at least one fixed orifice, and the moved end of the first rotor is connected to the first chain link element to make the first chain link element rotary connect to the first framework component;

wherein the fixed end of the first rotor is fixed on the second framework component by the at least one fixed orifice, and the moved end of the second rotor is connected to the second chain link element to make the second chain link element rotary connect to the second framework component.

According to some disclosures, the first chain link element comprises a padding layer disposed on inner walls of the groove.

According to some disclosures, the plurality of the rotors comprise at least two axis pins;

wherein the third chain link element and the fourth chain link element are connected to the flexible element by the at least two axis pins respectively.

According to some disclosures, the flexible element comprises a plurality of chain links and a plurality of fastenings; wherein the plurality of chain links are rotary connected to each other by the plurality of the fastenings.

The present disclosure provides a flexible display device comprising:

a supporting sheet and a middle frame comprising a first framework component, a second framework component and a flexible component comprising a first chain link element, a second chain link element, a third chain link element, a fourth chain link element, a flexible element and a plurality of rotors;

the first chain link element rotary connected to the first framework by the rotor, and slideably connected to the third chain link element by the rotor;

the third chain link element rotary connected to the flexible element by the rotor;

the second chain link element rotary connected to the second framework component by the rotor, and slideably connected to the fourth chain link element by the rotor;

the fourth chain link element rotary connected to the flexible element by the rotor;

the flexible supporting sheet comprising a first convex element;

the second framework component comprising a sliding slot matched with the first convex element;

the first convex element plugged into the sliding slot.

According to some disclosures, the plurality of rotors comprise a plurality of first rotors with a fixed end and a moved end, and both the first chain link element and the second chain link element have a groove;

wherein the fixed end of the first rotor is fixed on the third chain link element, and the moved end of the first rotor is extended to the groove of the first chain link element to slide along the groove of the first chain link element;

wherein the fixed end of the first rotor is fixed on the fourth chain link element, and the moved end of the first rotor is extended to the groove of the second chain link element to slide along the groove of the second chain link element.

According to some disclosures, the fixed end of the plurality of first rotors comprises at least one fixed orifice;

wherein the fixed end of the first rotor is fixed on the first framework component by the at least one fixed orifice, and the moved end of the first rotor is connected to the first chain link element to make the first chain link element rotary connect to the first framework component;

wherein the fixed end of the first rotor is fixed on the second framework component by the at least one fixed orifice, and the moved end of the second rotor is connected to the second chain link element to make the second chain link element rotary connect to the second framework component.

According to some disclosures, the first chain link element comprises a padding layer disposed on inner walls of the groove.

According to some disclosures, the plurality of the rotors comprise at least two axis pins;

wherein the third chain link element and the fourth chain link element are connected to the flexible element by the at least two axis pins respectively.

According to some disclosures, the flexible element comprises a plurality of chain links and a plurality of fastenings; wherein the plurality of chain links are rotary connected to each other by the plurality of the fastenings.

According to some disclosures, the flexible display device also comprises a housing comprising a first housing, a second housing and a bent element disposed between the first housing and the second housing.

The flexible display device as claimed in the claim 17, wherein the bent element comprises a supporting frame and a flexible skin member which are produced by an integral injection mode process.

According to some disclosures, the housing comprises a locating slot disposed on inner walls of the housing, and the flexible supporting sheet comprises a second convex element;

the second convex element plugged into the locating slot.

According to some disclosures, the flexible display device also comprises a flexible plate comprising a step, and the housing comprises a limiting slot matched with the step;

the step plugged into the limiting slot.

The present disclosure can improve the bending property of the flexible display device by disposing the flexible component of which the first chain link element, the second chain link element, the third chain link element, the fourth chain link element, the flexible element and a plurality of rotors work together.

Aforementioned contents of the present disclosure will be a better understood with reference to the following description, appended claims and accompanying figures.

DETAILED DESCRIPTION OF PREFERRED EMBODIMENTS

The following description of every embodiment with reference to the accompanying drawings is used to exemplify a specific embodiment which may be carried out in the present disclosure. Directional terms mentioned in the present disclosure, such as "top", "bottom", "front", "back", "left", "right", "inside", "outside", "side" etc., are only used with reference to the orientation of the accompanying drawings. Therefore, the used directional terms are intended to illustrate, but not to limit, the present disclosure. In the accompanying drawings, units with similar structures are indicated by the same sign.

Reference throughout the specification to "embodiment" means that a particular feature, structure, or characteristic described in connection with the embodiment is included in at least one embodiment. Thus, appearances of the phrases "embodiment" in places throughout the specification are may be combined in any suitable manner in one or more embodiments. Thus, the particular features, structures, or characteristics illustrated or described in connection with one embodiment may be combined, in whole or in part, with the features structures, or characteristics of one or more other embodiments without limitation. Such modifications and variations are intended to be included within the scope of the present invention.

Figure 1:
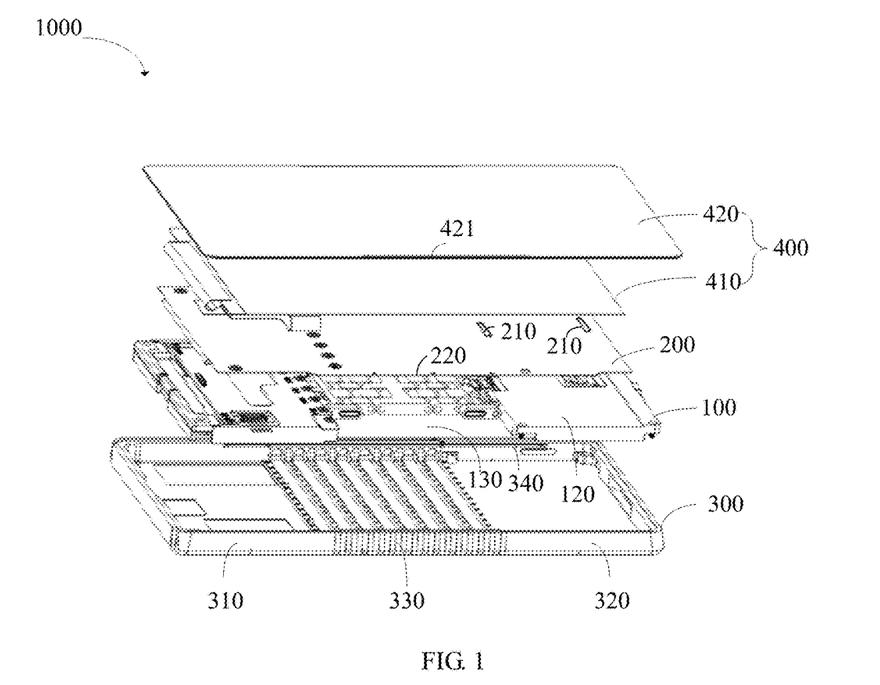
FIG. 1 is a structural schematic diagram of a flexible display device according to the present disclosure.

As shown in FIG. 1, FIG. 1 is a structural schematic diagram of a flexible display device according to the present disclosure. The flexible display device 1000 comprises a middle frame 100, a flexible supporting sheet 200, a housing 300, and a flexible display 400.

The flexible displays 400 comprise flexible organic light-emitting displays, flexible liquid crystal displays, flexible electrophoretic displays, and so on, where kinds of the flexible displays 400 are not limited herein. The flexible display 400 comprises a flexible display panel 410 and a flexible plate 420 which are adhered by optical cement. The flexible display 400 also comprises a flexible touch layer. The flexible display 400 are attached or coated with polarizing film to improve display.

Figure 2:
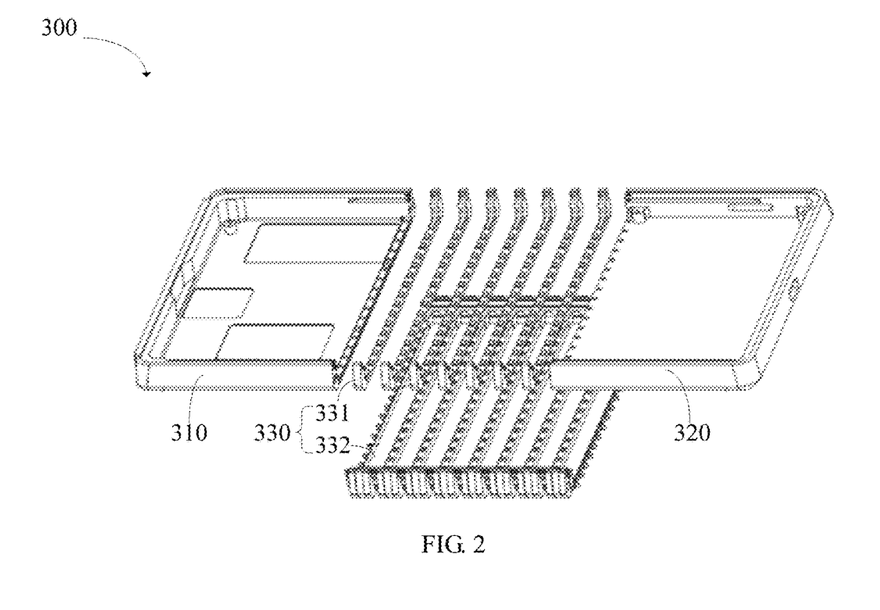
FIG. 2 is a structural schematic diagram of a housing according to the present disclosure.

As shown in FIG. 2, The housing 300 comprises a first housing 310, a second housing 320 and a bent element 330 disposed between the first housing 310 and the second housing 320. The first housing 310 and the second housing 320 are made of hard materials like aluminum alloys, hard plastics, stainless steel and so on. And the first housing 310 and the second housing 320 are used to dispose batteries, circuit boards, cameras and other electronic or mechanical components.

The bent element 330 comprises a supporting frame 331 and a flexible skin member 332 which are produced by an integral injection mode process. The flexible skin member 332 having a bending property can make the housing 300 bent.

Figure 3:
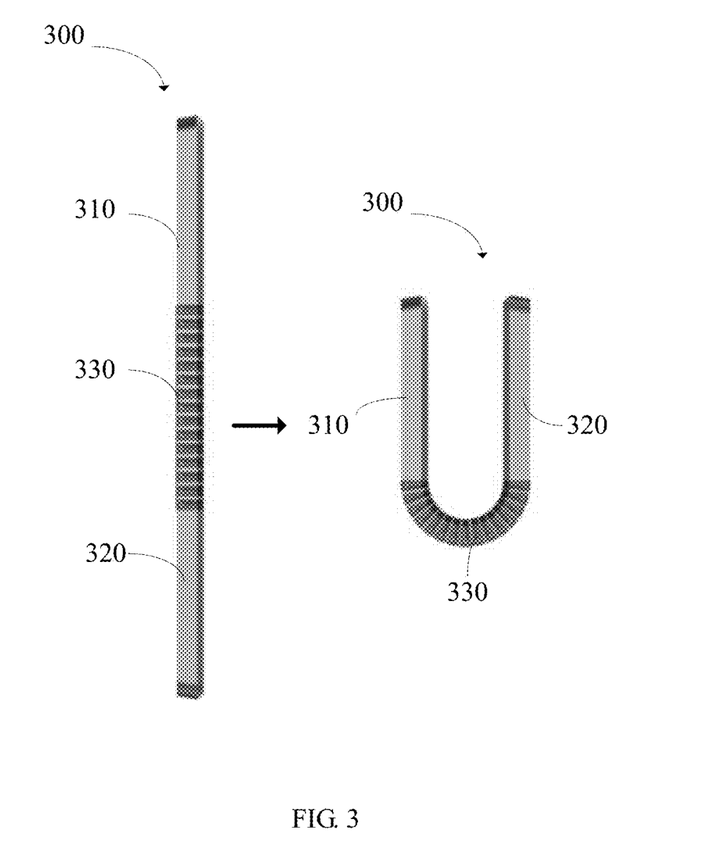
FIG. 3 is another structural schematic diagram of a housing according to the present disclosure.

Component materials of the supporting frame, which is a hard supporting frame, are same or different with component materials of the first housing 310 and the second housing 320, and are not limited herein. As shown in FIG. 3, the supporting frame 331 can support bent part of the flexible display device 1000 to avoid crumpling, when the flexible display device 1000 is in a bending state.

The bent element 330 also comprises a plurality of inverted member disposed between the first housing 310, the second housing 320, the supporting frame 331 and the flexible skin member 332 improve binding forces of them.

Furthermore, the first housing 310, the second housing 320, and the supporting frame 331 are roughened to avoid them being stripped from the flexible skin member 332.

As shown in FIG. 1, the housing 300 comprises a limiting slot, and the flexible plate 420 comprises a step 421 matched with the limiting slot. The step 421 plugged into the limiting slot can avoid the flexible plate 420 being stripped from the housing 300 when the flexible display device 1000 is in a bending state, and can encapsulate the middle frame 100, the flexible supporting sheet 200 and the flexible display panel 410 in the housing 300.

Figure 4:
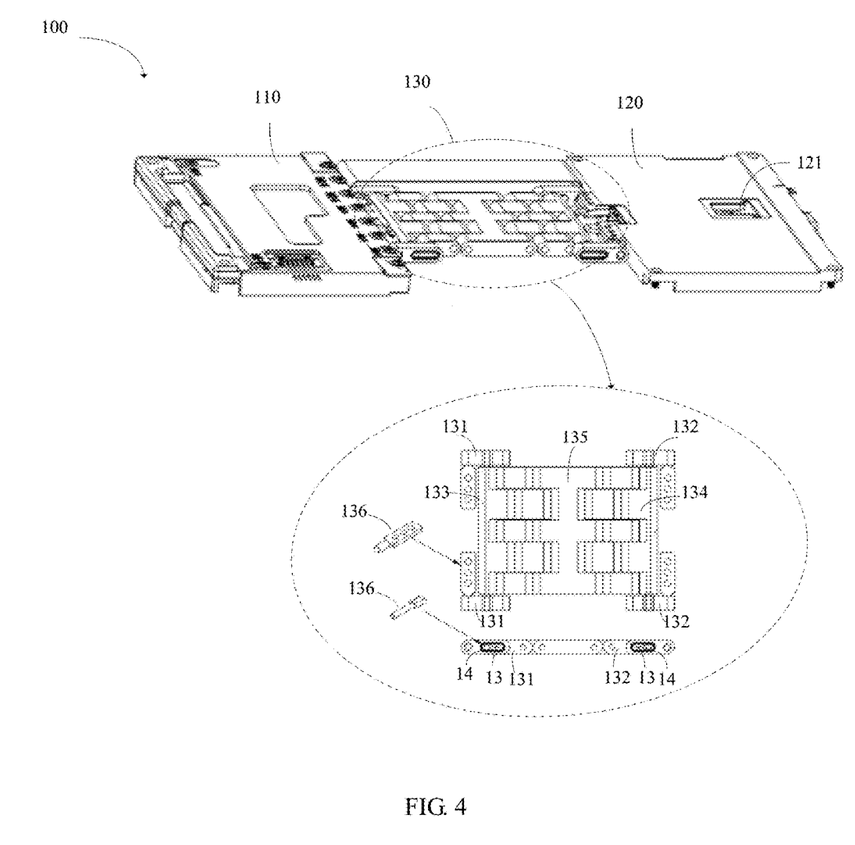
FIG. 4 is a first structural schematic diagram of a middle frame according to the present disclosure.

AS shown in FIG. 1 and FIG. 4, the middle frame 100 comprises a first framework component 110 matched with the first housing 310, a second framework component 120 matched with the second housing 320 and a flexible component 130 matched with the bent element 330.

As shown in FIG. 4, the flexible component 130 comprises a first chain link element 131, a second chain link element 132, a third chain link element 133, a fourth chain link element 134, a flexible element 135 and a plurality of rotors 136.

The first chain link element 131 is rotary connected to the first framework 136 by the rotor 136, and slideably connected to the third chain link element 133 by the rotor 136. The third chain link element 133 is rotary connected to the flexible element 135 by the rotor 136. The second chain link element 132 is rotary connected to the second framework 120 component by the rotor 136, and slideably connected to the fourth chain link element 134 by the rotor 136. The fourth chain link element 134 is rotary connected to the flexible element 135 by the rotor 136.

According to some disclosures, the plurality of rotors 136 comprise a plurality of first rotors with a fixed end and a moved end, and both the first chain link element 131 and the second chain link element 132 have a groove 13.

The fixed end of the first rotor is fixed on the third chain link element 133, and the moved end of the first rotor is extended to the groove 13 of the first chain link element 131 to slide along the groove 13 of the first chain link element 131. The third chain link element 133 is stretched relative to the first chain link 131 to compensate shape changes and to reduce stress of the flexible display device 1000, when the flexible display device 1000 is in a bending state.

The fixed end of the first rotor is fixed on the fourth chain link element 134, and the moved end of the first rotor is extended to the groove 13 of the second chain link element 132 to slide along the groove 13 of the second chain link element 132. The fourth chain link element 133 is stretched relative to the second chain link 132 to compensate shape changes and to reduce stress of the flexible display device 1000, when the flexible display device 1000 is in a bending state.

The fixed end of the plurality of first rotors comprises at least one fixed orifice. Wherein the fixed end of the first rotor is fixed on the first framework component 110 by the at least one fixed orifice, and the moved end of the first rotor is connected to the first chain link element 131 to make the first chain link element 131 rotary connect to the first framework component 110.

The fixed end of the first rotor is fixed on the second framework component 120 by the at least one fixed orifice, and the moved end of the second rotor is connected to the second chain link element 132 to make the second chain link element 132 rotary connect to the second framework component 120.

According to some disclosures, the first chain link element 131 comprises a padding layer 14 disposed on inner walls of the groove 13 to stop the first rotor sliding along the groove 13 of the first chain link element 131 at will.

According to some disclosures, the plurality of the rotors comprise at least two axis pins. The third chain link element 133 and the fourth chain link element 134 are connected to the flexible element 135 by the at least two axis pins respectively. The third chain link element 131, the fourth chain link element 134 and the flexible element 135 can slide relative to each other, when the flexible display device 1000 is in a bending state.

Figure 5:
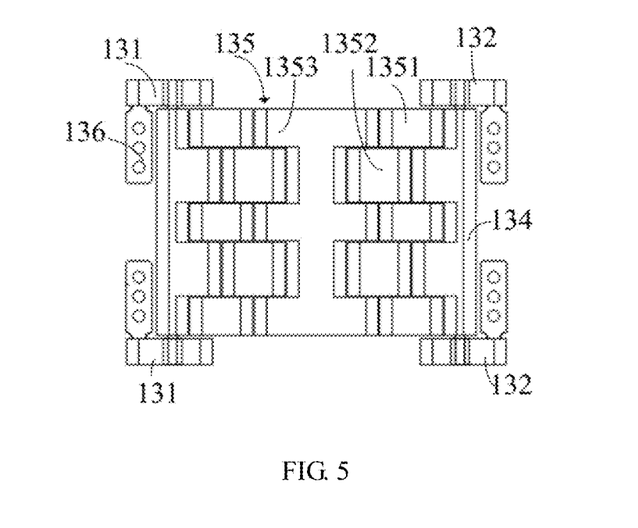
FIG. 5 is a second structural schematic diagram of a middle frame according to the present disclosure.
Figure 6:
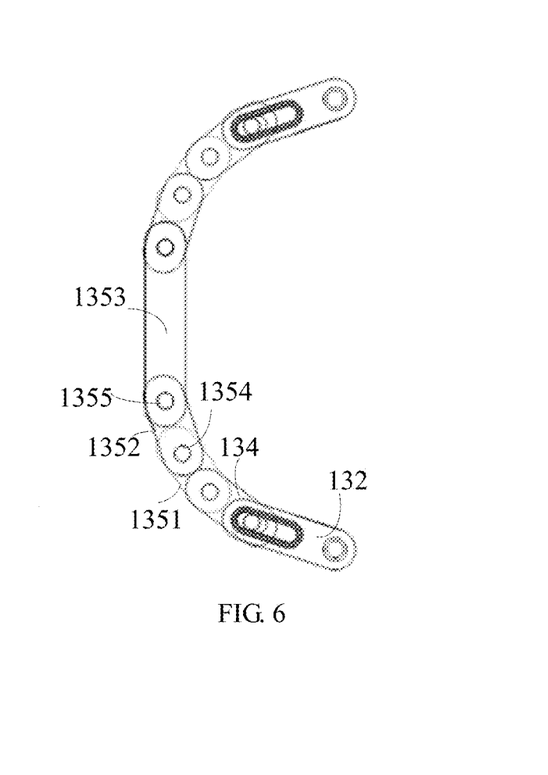
FIG. 6 is a third structural schematic diagram of a middle frame according to the present disclosure.

According to some disclosures, the flexible element 135 comprises a plurality of chain links like chain link 1351, chain link 1352, chain link 1353 and so on, as shown in FIG. 5. The flexible element 135 also comprises a plurality of fastenings, such as fastening 1354 connected to the chain link 1351 and the chain link 1352, and fastening 1355 connected to the chain link 1352 and the chain link 1353. Because the chain links connected to each other by the fastenings can rotor with each other under, the chain links can bend under collaboration of the fastenings when the flexible display device 1000 is in a bending state, as shown in FIG. 6.

Figure 7:
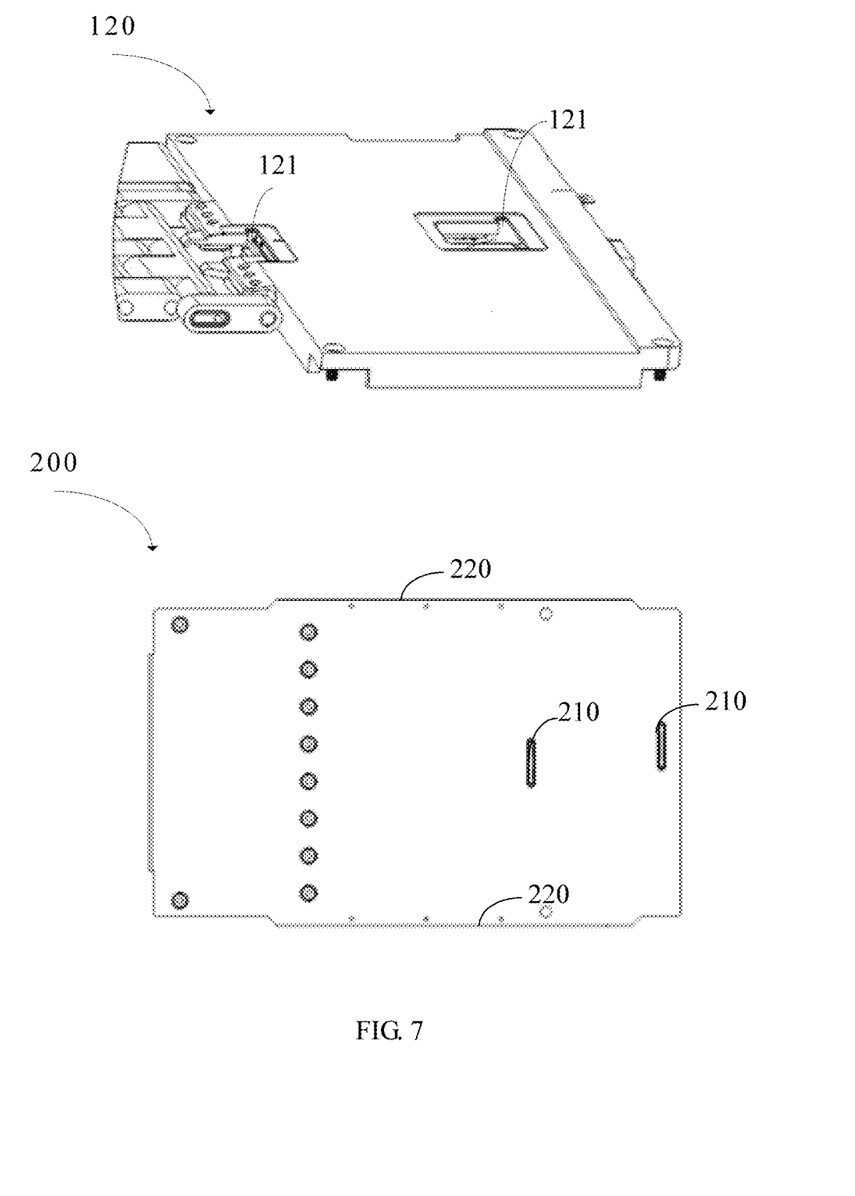
FIG. 7 is a structural collaboration diagram of a flexible supporting sheet and a second framework component according to the present disclosure.
Figure 8:
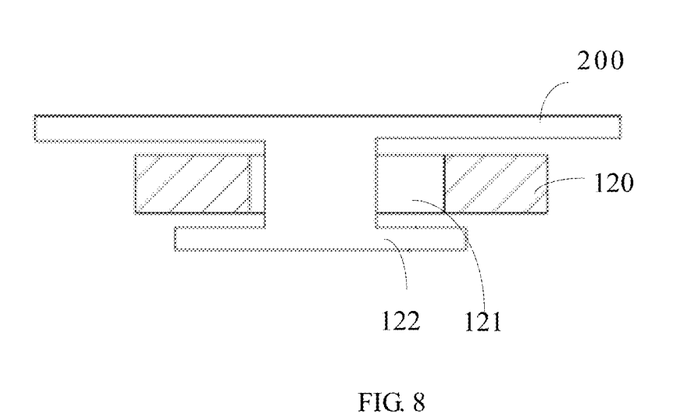
FIG. 8 is another structural collaboration diagram of a flexible supporting sheet and a second framework component according to the present disclosure.

As shown in FIG. 7, the flexible supporting sheet 200 comprises a first convex element 210, and the second framework component 120 comprises a sliding slot 1211 matched with the first convex element 210. The first convex element 210 is plugged into the sliding slot 121 to stop the flexible supporting sheet 200 sliding, when the flexible display device 1000 is in a bending state. As shown in FIG. 8, the flexible display device 1000 also comprises a limit element disposed in the sliding slot 121 to limit sliding distance of the flexible supporting sheet 200 and avoid an over bending degree of the flexible display device 1000, when the flexible display device 100 is in a bending state.

As shown in FIG. 1, the flexible supporting sheet 200 also comprises a second convex element 220, and the housing 300 comprises a locating slot 340 disposed on inner walls of the housing 300. The second convex element 220 is plugged into the locating slot 340.

The present disclosure can improve the bending property of the flexible display device by disposing the flexible component of which the first chain link element, the second chain link element, the third chain link element, the fourth chain link element, the flexible element and a plurality of rotors work together.

The present disclosure is described in detail in accordance with the above contents with the specific preferred examples. However, this present disclosure is not limited to the specific examples. For a person of ordinary skill in the art, on the premise of keeping the conception of the present disclosure, the technical personnel can also make simple deductions or replacements, all of which should be considered to belong to the protection scope of the present disclosure.

What is claimed is:

1. A middle frame comprising:
a first framework component, a second framework component and a flexible component comprising a first chain link element, a second chain link element, a third chain link element, a fourth chain link element, a flexible element and a plurality of rotors;
the first chain link element rotary connected to the first framework by the rotor, and slideably connected to the third chain link element by the rotor;
the third chain link element rotary connected to the flexible element by the rotor;
the second chain link element rotary connected to the second framework component by the rotor, and slideably connected to the fourth chain link element by the rotor;
the fourth chain link element rotary connected to the flexible element by the rotor;
wherein the plurality of rotors comprise a plurality of first rotors with a fixed end and a moved end, and both the first chain link element and the second chain link element have a groove;
wherein the fixed end of the first rotor is fixed on the third chain link element, and the moved end of the first rotor is extended to the groove of the first chain link element to slide along the groove of the first chain link element;
wherein the fixed end of the first rotor is fixed on the fourth chain link element, and the moved end of the first rotor is extended to the groove of the second chain link element to slide along the groove of the second chain link element;
the plurality of the rotors comprise at least two axis pins;
wherein the third chain link element and the fourth chain link element are connected to the flexible element by the at least two axis pins respectively.

2. The middle frame as claimed in claim 1, wherein the fixed end of the plurality of first rotors comprises at least one fixed orifice;
wherein the fixed end of the first rotor is fixed on the first framework component by the at least one fixed orifice, and the moved end of the first rotor is connected to the first chain link element to make the first chain link element rotary connect to the first framework component;
wherein the fixed end of the first rotor is fixed on the second framework component by the at least one fixed orifice, and the moved end of the second rotor is connected to the second chain link element to make the second chain link element rotary connect to the second framework component.

3. The middle frame as claimed in claim 1, wherein the first chain link element comprises a padding layer disposed on inner walls of the groove.

4. The middle frame as claimed in claim 1, wherein the flexible element comprises a plurality of chain links and a plurality of fastenings;
wherein the plurality of chain links are rotary connected to each other by the plurality of the fastenings.

5. A middle frame comprising:
a first framework component, a second framework component and a flexible component comprising a first chain link element, a second chain link element, a third chain link element, a fourth chain link element, a flexible element and a plurality of rotors;
the first chain link element rotary connected to the first framework by the rotor, and slideably connected to the third chain link element by the rotor;
the third chain link element rotary connected to the flexible element by the rotor;
second chain link element rotary connected to the second framework component by the rotor, and slideably connected to the fourth chain link element by the rotor;
the fourth chain link element rotary connected to the flexible element by the rotor,
wherein the plurality of rotors comprise a plurality of first rotors with a fixed end and a moved end, and both the first chain link element and the second chain link element have a groove:
wherein the fixed end of the first rotor is fixed on the third chain link element, and the moved end of the first rotor is extended to the groove of the first chain link element to slide along the groove of the first chain link element;
wherein the fixed end of the first rotor is fixed on the fourth chain link element, and the moved end of the first rotor is extended to the groove of the second chain link element to slide along the groove of the second chain link element.

6. The middle frame as claimed in claim 5, wherein the fixed end of the plurality of first rotors comprises at least one fixed orifice;
wherein the fixed end of the first rotor is fixed on the first framework component by the at least one fixed orifice, and the moved end of the first rotor is connected to the first chain link element to make the first chain link element rotary connect to the first framework component;
wherein the fixed end of the first rotor is fixed on the second framework component by the at least one fixed orifice, and the moved end of the second rotor is connected to the second chain link element to make the second chain link element rotary connect to the second framework component.

7. The middle frame as claimed in claim 5, wherein the first chain link element comprises a padding layer disposed on inner walls of the groove.

8. The middle frame as claimed in claim 5, wherein the plurality of the rotors comprise at least two axis pins;
wherein the third chain link element and the fourth chain link element are connected to the flexible element by the at least two axis pins respectively.

9. The middle frame as claimed in claim 5, wherein the flexible element comprises a plurality of chain links and a plurality of fastenings;
wherein the plurality of chain links are rotary connected to each other by the plurality of the fastenings.

10. A flexible display device comprising:
a supporting sheet and a middle frame comprising a first framework component, a second framework component and a flexible component comprising a first chain link element, a second chain link element, a third chain link element, a fourth chain link element, a flexible element and a plurality of rotors;
the first chain link element rotary connected to the first framework by the rotor, and slideably connected to the third chain link element by the rotor;
the third chain link element rotary connected to the flexible element by the rotor;
the second chain link element rotary connected to the second framework component by the rotor, and slideably connected to the fourth chain link element by the rotor;
the fourth chain link element rotary connected to the flexible element by the rotor;
the flexible supporting sheet comprising a first convex element;
the second framework component comprising a sliding slot matched with the first convex element;
the first convex element plugged into the sliding slot.

11. The flexible display device as claimed in claim 10, wherein the plurality of rotors comprise a plurality of first rotors with a fixed end and a moved end, and both the first chain link element and the second chain link element have a groove;
wherein the fixed end of the first rotor is fixed on the third chain link element, and the moved end of the first rotor is extended to the groove of the first chain link element to slide along the groove of the first chain link element;
wherein the fixed end of the first rotor is fixed on the fourth chain link element, and the moved end of the first rotor is extended to the groove of the second chain link element to slide along the groove of the second chain link element.

12. The flexible display device as claimed in claim 11, wherein the fixed end of the plurality of first rotors comprises at least one fixed orifice;
wherein the fixed end of the first rotor is fixed on the first framework component by the at least one fixed orifice, and the moved end of the first rotor is connected to the first chain link element to make the first chain link element rotary connect to the first framework component;
wherein the fixed end of the first rotor is fixed on the second framework component by the at least one fixed orifice, and the moved end of the second rotor is connected to the second chain link element to make the second chain link element rotary connect to the second framework component.

13. The flexible display device as claimed in claim 11, wherein the first chain link element comprises a padding layer disposed on inner walls of the groove.

14. The flexible display device as claimed in claim 11, wherein the plurality of the rotors comprise at least two axis pins;
wherein the third chain link element and the fourth chain link element are connected to the flexible element by the at least two axis pins respectively.

15. The flexible display device as claimed in claim 11, wherein the flexible element comprises a plurality of chain links and a plurality of fastenings;
wherein the plurality of chain links are rotary connected to each other by the plurality of the fastenings.

16. The flexible display device as claimed in the claim 11, wherein the flexible display device also comprises a housing comprising a first housing, a second housing and a bent element disposed between the first housing and the second housing.

17. The flexible display device as claimed in the claim 16, wherein the bent element comprises a supporting frame and a flexible skin member which are produced by an integral injection mode process.

18. The flexible display device as claimed in the claim 16, wherein the housing comprises a locating slot disposed on inner walls of the housing, and the flexible supporting sheet comprises a second convex element;
the second convex element plugged into the locating slot.

19. The flexible display device as claimed in the claim 16, wherein the flexible display device also comprises a flexible plate comprising a step, and the housing comprises a limiting slot matched with the step;
the step plugged into the limiting slot.

* * * * *